United States Patent
Ulrich et al.

(10) Patent No.: US 7,727,897 B2
(45) Date of Patent: Jun. 1, 2010

(54) METHOD OF ETCHING A TE/PCMO STACK USING AN ETCH STOP LAYER

(75) Inventors: Bruce D. Ulrich, Beaverton, OR (US);
Lisa H. Stecker, Vancouver, WA (US);
Fengyan Zhang, Vancouver, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 1310 days.

(21) Appl. No.: 11/215,519

(22) Filed: Aug. 30, 2005

(65) Prior Publication Data
US 2007/0049029 A1 Mar. 1, 2007

(51) Int. Cl.
H01L 21/302 (2006.01)
(52) U.S. Cl. .............. 438/706; 438/707; 438/714; 438/721; 438/722; 438/723
(58) Field of Classification Search .............. 438/3, 438/706, 707, 714, 721, 722, 723
See application file for complete search history.

(56) References Cited

U.S. PATENT DOCUMENTS

| | | | |
|---|---|---|---|
| 6,277,760 B1 * | 8/2001 | Lee et al. .............. | 438/706 |
| 6,534,871 B2 | 3/2003 | Maa et al. | |
| 6,576,941 B1 * | 6/2003 | Lee et al. .............. | 257/295 |
| 6,720,258 B2 | 4/2004 | Maa et al. | |
| 6,756,262 B1 * | 6/2004 | Nakamura et al. .......... | 438/240 |
| 2003/0205734 A1 * | 11/2003 | Lee et al. .............. | 257/200 |
| 2004/0104417 A1 * | 6/2004 | Song et al. .............. | 257/296 |
| 2005/0142667 A1 * | 6/2005 | Kim et al. .............. | 438/3 |
| 2005/0244988 A1 * | 11/2005 | Wang et al. .............. | 438/3 |
| 2006/0134808 A1 * | 6/2006 | Summerfelt et al. .......... | 438/3 |
| 2008/0081380 A1 * | 4/2008 | Celii et al. .............. | 438/3 |

* cited by examiner

Primary Examiner—Binh X Tran
(74) Attorney, Agent, or Firm—David C. Ripma

(57) ABSTRACT

A method of etching a top electrode/ferroelectric stack using an etch stop layer includes forming a first layer of a first dielectric material on a substrate; forming a bottom electrode in the first layer of a first dielectric material; depositing an etch stop layer on the first layer of the first dielectric material and the bottom electrode, including forming a hole therein; depositing a layer of ferroelectric material and depositing top electrode material on the ferroelectric material to form a top electrode/ferroelectric stack; stack etching the top electrode and ferroelectric material; depositing a layer of a second dielectric material encapsulating the top electrode and ferroelectric material; etching the layer of the second dielectric material to form a sidewall about the top electrode and ferroelectric material; and depositing a second and third layers of the first dielectric material.

4 Claims, 2 Drawing Sheets

METHOD OF ETCHING A TE/PCMO STACK USING AN ETCH STOP LAYER

FIELD OF THE INVENTION

This invention relates to etching of ferroelectric material formed with metal electrodes, and specifically to a method of stack etching a ferroelectric/electrode stack without re-depositing etched electrode material.

BACKGROUND OF THE INVENTION

During etching of a PCMO layer and a platinum electrode in contact with the PCMO layer, which is generally a sputter etching process, platinum re-deposition frequently occurs. As the PCMO layer is directly in contact with the platinum layer, e.g., as in the case of a platinum bottom electrode, over etching of the PCMO for a hole will redeposit platinum on the PCMO sidewalls. This is also the case when the bottom electrode is formed of other metals, such as iridium, rubidium, iridium oxide, and $Y_xBa_2Cu_3O_{7-x}$ (YBCO). The redeposited metal provides a conductive path between a top electrode and the bottom electrode. This is essentially a short circuit, and is not desired, and must be avoided for proper memory operation.

U.S. Pat. No. 6,534,871, of Maa et al., granted Mar. 18, 2003, for Device including an epitaxial nickel silicide on (100) Si or stable nickel silicide on amorphous Si and a method of fabricating the same; and U.S. Pat. No. 6,720,258, to Maa et al., granted Apr. 13, 2004, for Method of fabricating a nickel silicide on a substrate.

SUMMARY OF THE INVENTION

A method of etching a top electrode/ferroelectric stack using an etch stop layer includes preparing a substrate; forming a first layer of a first dielectric material on the substrate; forming a bottom electrode in the first layer of a first dielectric material; depositing a first, etch stop layer of a second dielectric material on the first layer of a first dielectric material and the bottom electrode, including forming a hole in the first layer of the second dielectric material exposing a portion of the bottom electrode; depositing a layer of PCMO material on the first layer of the second dielectric material, and extending through the hole to the bottom electrode; depositing top electrode material on the PCMO material to form a top electrode/PCMO stack; stack etching the top electrode and PCMO material, stopping at the level of the etch stop layer; depositing a second layer of a second dielectric material on the first layer of the second dielectric material and encapsulating the top electrode and PCMO material; etching the second layer of the second dielectric material to form a sidewall about the top electrode and PCMO material; depositing a second layer of the first dielectric material; smoothing the second layer of the first dielectric material by CMP; depositing a third layer of the first dielectric material; etching contact holes through the layers of the first and second dielectric material to the bottom and top electrodes; and metallizing the ferroelectric stack.

It is an object of the invention to prevent re-deposition of an electrode metal following an etching process on a PCMO stack.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The present invention improves on techniques developed in the art of stack etching and in the art of damascene etching. In the stack etching prior art, the etch is completed on the bottom electrode. In the present invention, the etch is completed on a dielectric, such as silicon nitride. This dielectric may include such materials as $SiO_2$, $TiO_2$, $HfO_2$, $ZrO_2$ or $TaO_2$. Titanium or TiN may also be deposited onto the dielectric and may be used as an etch stop. The dielectric, titanium or TiN formed on the dielectric, is patterned prior to PCMO deposition.

In the prior art damascene process, the thickness of the dielectric must be thick enough to act as a CMP stop, e.g., a typical thickness is about 230 nm. However, given a dielectric layer of this thickness, dishing occurs, reducing the PCMO thickness at the center of the active area. As a result of providing such a CMP stop, and as a result of subsequent dishing, the dielectric thickness must be greater than would otherwise be require to practice the method of the invention. Cusping of the sputtered PCMO occurs due to shadowing of the edges of a dielectric hole, or process window, as the sputtered material impinges the process window during the deposition process, resulting in gaps in the sputtered material along the sidewalls of the process window. In the present invention, a relatively thin dielectric, having a thickness of between about 30 nm to 50 nm, is deposited and a process window, or hole, is made therein. Cusping is minimized because of the thinness of the material in which the hole is formed, e.g., as previously noted, the state of the art method required a CMP stop layer having a thickness greater than 200 nm, compared to the 30 nm to 50 nm thickness of the CMP stop layer using the method of the invention, which also minimizes re-deposition of etched electrode material. Thus the 30 nm to 50 nm thickness of the CMP stop layer is critical to the method of the invention.

Figure 1:
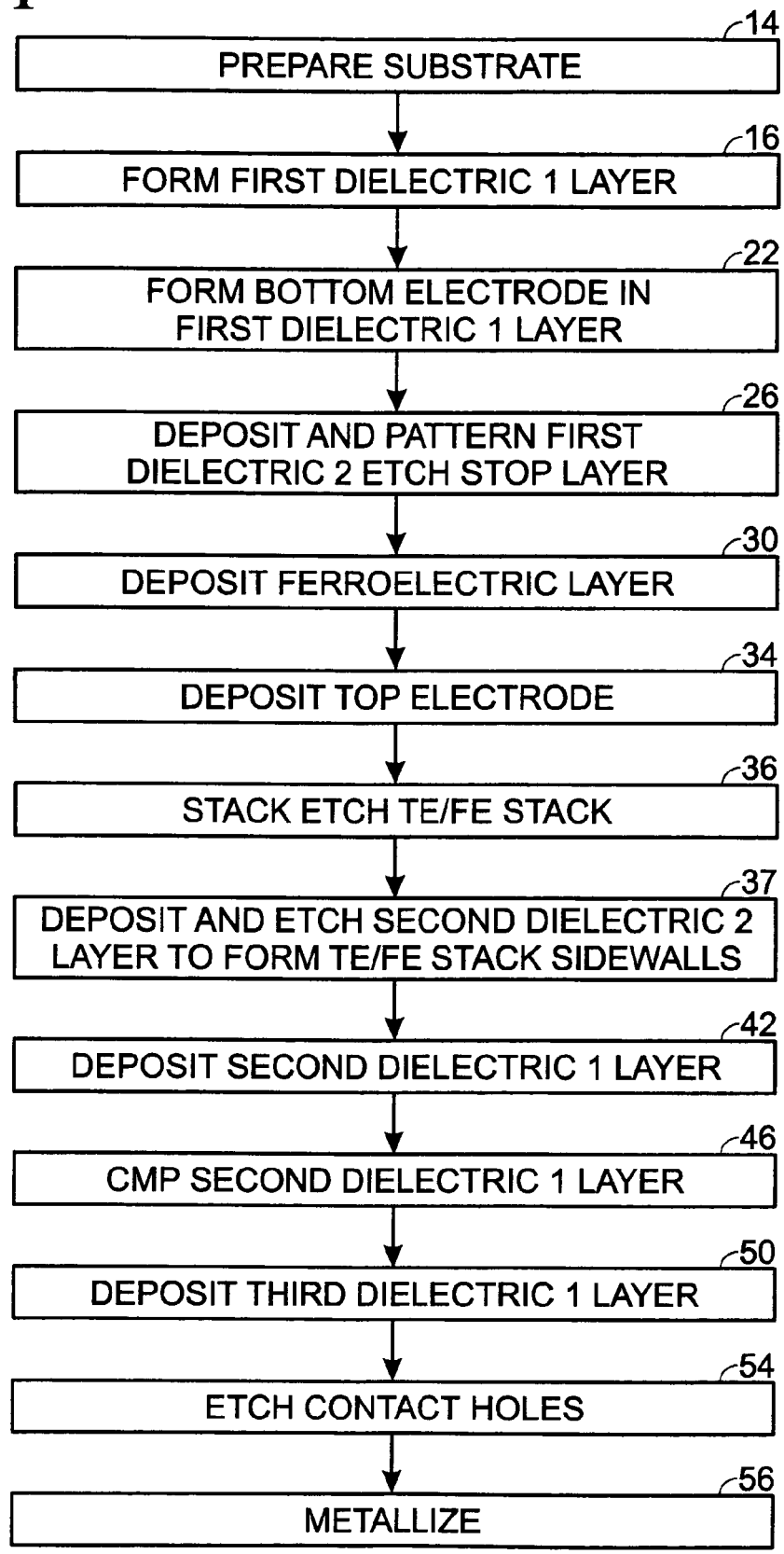
FIG. 1 is a block diagram of the method of the invention.
Figure 2:
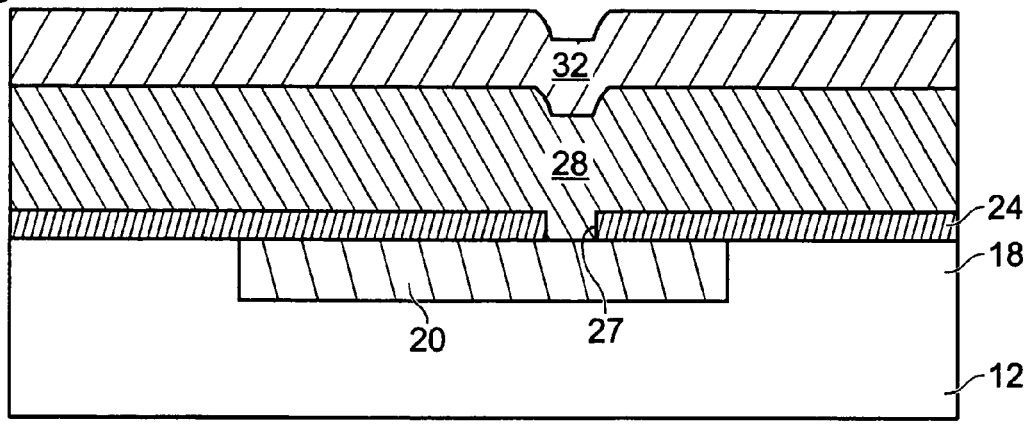
FIGS. 2 to 4 depict successive sections through a PCMO stack during practice of the method of the invention.
Figure 3:
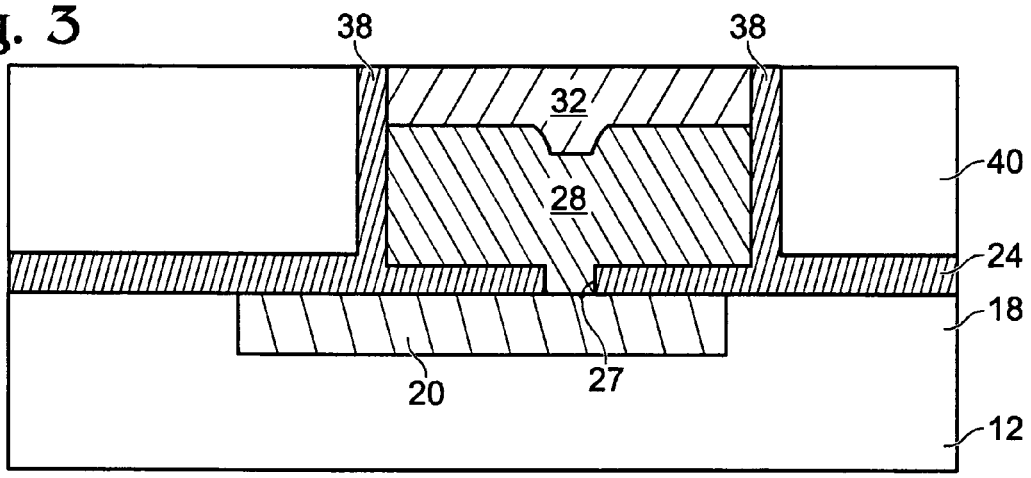
Figure 4:
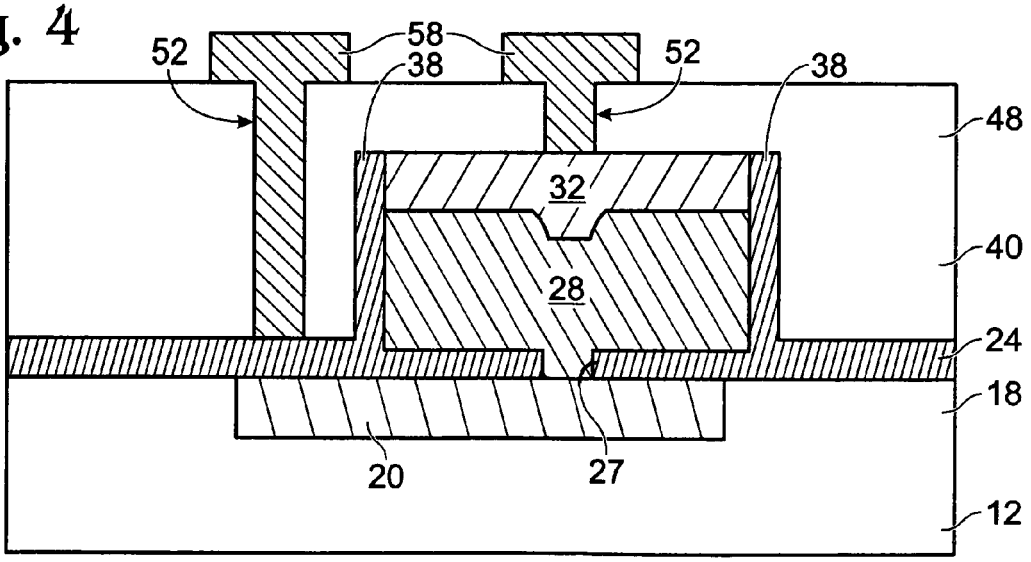

The method of the invention is depicted generally at 10 in FIG. 1, and the various steps of the method of the invention are depicted in FIGS. 2-4. A substrate 12 is prepared 14, including deposition 16 of a dielectric layer (dielectric 1) 18, to a thickness of between about 400 nm to 1000 nm. Dielectric 1 may be taken from the group of dielectrics consisting of $SiO_2$, $Si_3N_4$, $SiO_x$, TiO, $ZrO_2$, $TaO_2$, etc. A bottom electrode 20, which may be formed of Pt, Pd, Ti, TiN, TaN, Al, Cu, etc., is formed 22 in dielectric layer 18. A second layer of dielectric material 24 (dielectric 2) is deposited and patterned 26, including provision of a process window, or hole, 27, in dielectric material 24, exposing a portion of bottom electrode 20. Dielectric 2 is a dielectric taken from the groups of dielectrics consisting of silicon nitride, $SiO_2$, $TiO_2$, $HfO_2$, $ZrO_2$ or $TaO_2$. Additionally, titanium or TiN may be used as/in place of dielectric 2 layer 24 to serve as an etch stop layer. A ferroelectric layer 28, such as $Pr_{0.7}Ca_{0.3}MnO_3$ (PCMO), is deposited 26, and a top electrode (TE) layer 32 is deposited 34 on the ferroelectric layer, forming a top electrode/ferroelectric (TE/FE) stack.

Turning to FIG. 3, the TE/FE layers are stack etched, 36. Another layer (second layer) of dielectric 2 is deposited, encapsulating the TE/FE stack, and is etched 37 to provide a sidewall 38 for the TE/FE stack. Another layer of dielectric 1

(second layer of dielectric 1) 40 is deposited 42. CMP 46 of dielectric layer 40 is then performed, stopping at the level of top electrode 32.

As shown in FIG. 4, more dielectric 1 (third layer of dielectric 1) 48 is deposited 50 to cover top electrode 32. Contact holes 52 are then etched 54 to allow contact with top electrode 32 and bottom electrode 20. Metallization is then performed 56, to provide contacts 58 to the electrodes. As shown in the drawings and as described in this Specification, the description includes all steps of the best mode of practicing the invention. There are no additional steps, and the various layers, as described, are formed and/or deposited in sequence without any intervening steps or layers.

Thus, a method of etching a TE/FE stack using an etch stop layer has been disclosed. The thickness of the dielectric 2 etch stop layer is significantly less than that which would be required using convention stack etching or damascene processes. It will be appreciated that further variations and modifications thereof may be made within the scope of the invention as defined in the appended claims.

The invention claimed is:

1. A method of etching a top electrode/ferroelectric stack using an etch stop layer, comprising:
   preparing a substrate;
   forming a first layer of a first dielectric material on the substrate;
   forming a bottom electrode in the first layer of the first dielectric material;
   depositing an etch stop layer on the first layer of the first dielectric material and the bottom electrode, including forming a hole in the first layer of the etch stop layer exposing a portion of the bottom electrode;
   depositing a layer of PCMO material on the etch stop layer and extending through the hole to the bottom electrode;
   depositing top electrode material on the PCMO material to form a top electrode/PCMO stack;
   stack etching the top electrode and PCMO material, stopping at the level of the etch stop layer;
   depositing a layer of a second dielectric material on the etch stop layer and encapsulating the top electrode and PCMO material;
   etching the layer of the second dielectric material to form a sidewall about the top electrode and PCMO material;
   depositing a second layer of the first dielectric material;
   smoothing the a second layer of the first dielectric material by CMP;
   depositing a third layer of the first dielectric material;
   etching contact holes through the layers of the first and second dielectric material to the bottom and top electrodes; and
   metallizing the ferroelectric stack.

2. The method of claim 1 wherein the first dielectric material is taken from the group of dielectric materials consisting of $SiO_2$, $Si_3N_4$, $SiO_x$, $TiO$, $ZrO_2$ and $TaO_2$.

3. The method of claim 1 wherein the second dielectric material is taken from the group of dielectric materials consisting of $SiO_2$, $TiO_2$, $HfO_2$, $ZrO_2$ and $TaO_2$.

4. The method of claim 1 wherein the etch stop layer is formed of a material taken from the group of materials consisting of $SiO_2$, $TiO_2$, $HfO_2$, $ZrO_2$, $TaO_2$, titanium and TiN.

* * * * *